United States Patent [19]

Kitazawa et al.

[11] 4,155,049

[45] May 15, 1979

[54] AUTOMATIC FREQUENCY CONTROL CIRCUIT FOR TELEVISION HORIZONTAL OSCILLATOR

[75] Inventors: Hiroo Kitazawa, Gyoda; Masato Tanabe, Kumagaya, both of Japan

[73] Assignee: Tokyo Shibaura Electric Co., Ltd., Kawasaki, Japan

[21] Appl. No.: 865,111

[22] Filed: Dec. 28, 1977

[30] Foreign Application Priority Data

Dec. 28, 1976 [JP] Japan .................................. 51-157363
Dec. 28, 1976 [JP] Japan .................................. 51-157366
Dec. 28, 1976 [JP] Japan .................................. 51-157367
Mar. 16, 1977 [JP] Japan .................................. 52-28002

[51] Int. Cl.$^2$ ......................... H03B 3/04; H04N 5/04
[52] U.S. Cl. ......................................... 331/8; 331/20; 331/27; 331/34; 331/111; 331/177 R; 358/156; 358/159
[58] Field of Search .................... 331/8, 20, 25, 27, 34; 358/155, 156, 158, 159

[56] References Cited

U.S. PATENT DOCUMENTS

| 3,593,179 | 7/1971 | Hovens et al. ............................. 331/8 |
| 3,885,201 | 5/1975 | Fernsler ............................. 331/20 X |

FOREIGN PATENT DOCUMENTS

48-102960 12/1973 Japan ........................................ 331/111
49-48268 5/1974 Japan ........................................ 331/111

OTHER PUBLICATIONS

Fitchen, "Electronic Integrated Circuits and Systems," Van Nostrand Reinhold Company, New York, pp. 122–134, 1970.

Wilcox, "A TV Horizontal I/C," IEEE Transactions on Broadcast and Television Receivers, vol. BTR-19, Feb. 1973, pp. 65–72.

*Primary Examiner*—Siegfried H. Grimm
*Attorney, Agent, or Firm*—Cushman, Darby & Cushman

[57] ABSTRACT

An automatic frequency control circuit comprising two switching transistors with the emitter-collector paths thereof connected in series with each other between a power source and a reference voltage source, a horizontal synchronizing signal being commonly coupled to the bases of the switching transistors, an integrating circuit having an input terminal receiving a horizontal pulse signal and an output terminal connected to the emitter-collector juncture between said two switching transistors, a smoothing circuit to convert the output voltage of said integrating circuit into a d-c voltage, and a voltage controlled oscillator to produce a frequency output in accordance with the d-c output voltage of the smoothing circuit, the output of said oscillator being fed back to the input terminal of said integrating circuit.

8 Claims, 9 Drawing Figures

AUTOMATIC FREQUENCY CONTROL CIRCUIT FOR TELEVISION HORIZONTAL OSCILLATOR

This invention relates to an automatic frequency control circuit and, more particularly, one which can be suitably used for a horizontal synchronizing circuit of a semiconductor integrated circuit of a television receiver set.

Hitherto, the automatic frequency control circuit (hereinafter referred to as AFC circuit) has been used in the horizontal synchronizing circuit of the television receiver in order to synchronize the horizontal oscillating frequency with the horizontal synchronizing signal in the received television signal. These AFC circuits are roughly classed into circuits making use of diodes and those using transistors of integrated differential structures. The circuits using the differential structure transistors are used for television receivers of semiconductor integrated circuits. When making semiconductor integrated circuits, it is generally required to reduce the number of terminal pins to as small number as possible, and this also applies to the AFC circuit; the prior-art structure has at least three terminals, namely synchronizing signal input terminal, phase comparison signal input terminal and output terminal, and this constitutes an obstacle in the size reduction of the semiconductor integrated circuit.

An object of the invention, accordingly, is to provide an AFC circuit having a structure permitting the size reduction of the semiconductor integrated circuit with reduction of the number of terminal pins.

The invention features an automatic frequency control circuit comprising two switching transistors with the emitter-collector paths thereof connected in series with each other between a power source and a reference voltage source, means for commonly coupling horizontal synchronizing signal being commonly coupled to the bases of the switching transistors, an integrating circuit having an input terminal receiving a horizontal pulse signal and an output terminal connected to the emitter-collector juncture between said two switching transistors, a smoothing circuit to convert the output voltage of said integrating circuit into a d-c voltage, and a voltage control oscillator to produce a frequency output in accordance with the d-c output voltage of the smoothing circuit, the output of said oscillator being fed back to the input terminal of said integrating circuit.

This invention can be more fully understood from the following detailed description when taken in conjunction with the accompanying drawings, in which:

FIGS. 3A, 3B and 3C are waveform charts for illustrating the operation of the AFC circuit in FIG. 2;

FIGS. 5 and 6 are signal waveform charts showing the operation of the circuit of FIG. 4.

Figure 1:
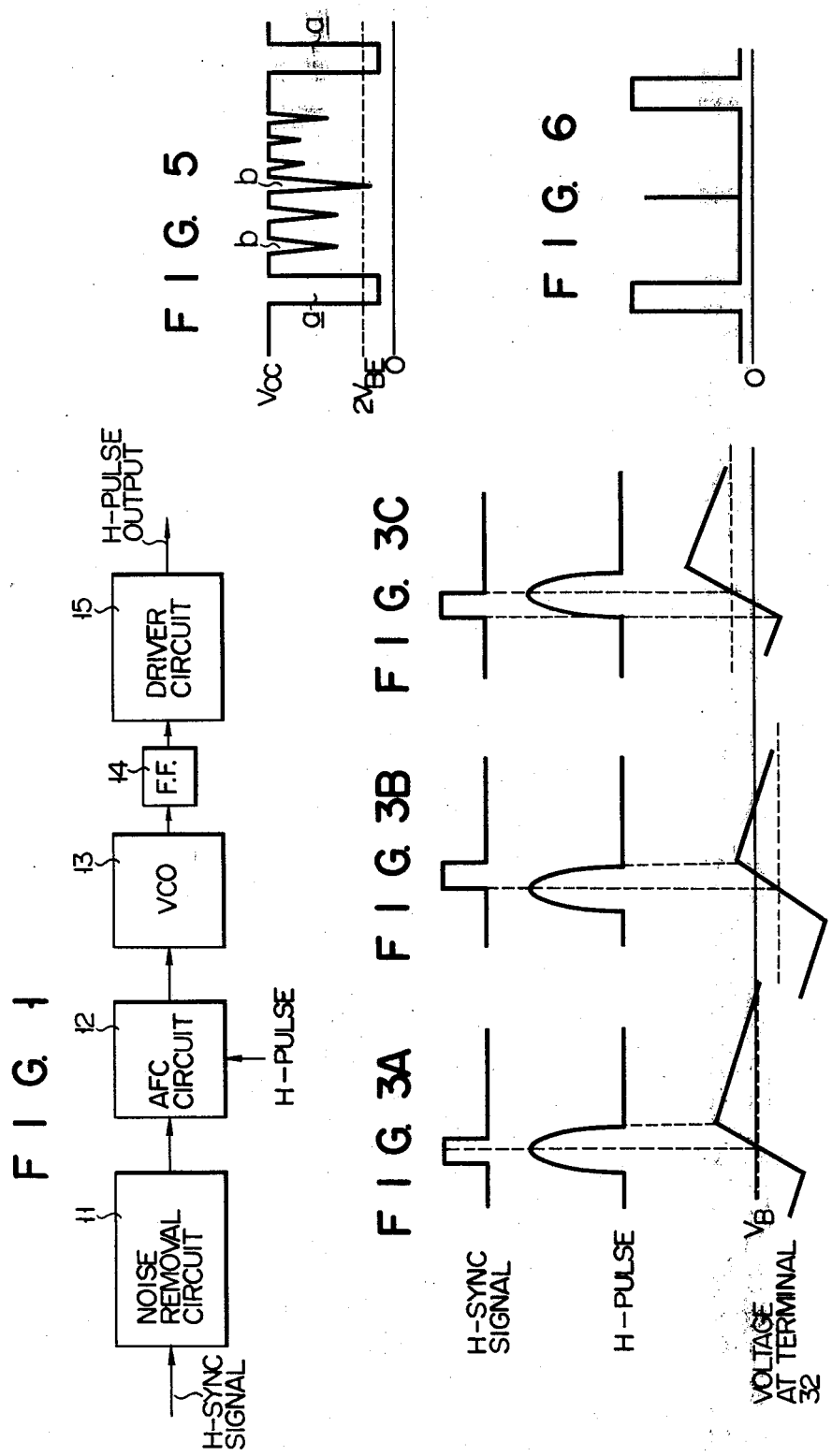
FIG. 1 is a block diagram of a horizontal synchronizing output circuit including an AFC circuit according to the invention.

Referring now to FIG. 1, a horizontal synchronizing signal (H-sync signal) separated from the received television signal in a sync signal separator circuit (not shown) is coupled to a noise removal circuit 11, in which undesired noise components are removed. The resultant H-snyc signal now free from undesired noise components is then coupled as reference signal to an automatic frequency control circuit (AFC circuit) 12. To the AFC circuit 12 is also supplied a horizontal output sgnal (H-pulse, e.g. a flyback pulse) as comparison signal, and the phases of both the inputs are compared there. The AFC circuit 12 supplies a d-c output voltage proportional to the phase difference, produced as the result of phase comparison, to a control voltage input terminal of a voltage controlled oscillator (VCO) 13. The VCO produces a pulse output of a frequency corresponding to the value of this control voltage. This pulse output is, if necessary, frequency divided into one half the frequency by a flip-flop FF before it is supplied to a horizontal driver circuit 15. The horizontal driver circuit drives a horizontal output circuit for generating a fly-back signal of very high voltage. When this high voltage becomes extraordinarily high, such inconvenience as generation of X-rays from cathode-ray tube results, and accordingly a protection circuit for preventing this from occurring is provided.

In accordance with the invention, particularly, the number of terminal pins of the AFC circuit 12 is reduced so as to facilitate fabrication of the entire horizontal synchronizing circuit as shown in FIG. 1 as a semiconductor integrated circuit.

Now, a specific circuit construction of the AFC circuit 12 and VCO 13 in the embodiment of FIG. 1 will be described with reference to FIG. 2. In the Figure, a synchronizing signal input terminal 21 of the AFC circuit 12 is connected to the base of an NPN transistor 22 with the emitter thereof connected to the reference voltage point, that is, grounded and with the collector connected to the cathode of a first diode 23, which has its anode connected through resistors 24 and 25 to a $V_{CC}$ power source terminal 26. The collector of the transistor 22 is also connected to the anode of a second diode 27 having the cathode thereof connected to the base of an NPN transistor 28. The collector of the transistor 28 is connected to the emitter of a further NPN transistor 29 having the collector thereof connected to the juncture between the resistors 24 and 25. The base of the transistor 29 is connected to the cathode of a third diode 30 with the anode thereof connected to the juncture between the resistor 24 and first diode 23. The juncture between the collector of the transistor 28 and emitter of the transistor 29 is connected through a resistor 31 to a comparison signal input terminal 32 of an integrating circuit 33. The emitter of the transistor 28 is connected to a reference voltage generating circuit 34. In the reference voltage generating circuit 34, an NPN transistor 36 has its collector connected through a resistor 35 to the afore-mentioned power source terminal 26. The emitter of the transistor 36 is connected to the emitter of the transistor 28 and also to the collector of an NPN transistor 37, which has its emitter grounded directly and its base grounded through a resistor 38. A zener diode 39 is connected between the resistor 38 and the collector of the transistor 36. The base of the transistor 36 is connected to the juncture between resistors 40 and 41 connected in series between the power source terminal 26 and earth. The reference voltage generating circuit 34 and the afore-mentioned circuit are formed in the same integrated circuit having a comparison signal input terminal 32. The afore-mentioned comparison signal input terminal 32 is connected through a series circuit consisting of a capacitor 42 and a resistor 43 to a terminal 44, to which a horizontal pulse signal (i.e., flyback pulse signal) is supplied. The comparison signal input terminal 32 is grounded through a capacitor 45, and also it is connected through a smoothing circuit 50 consisting of a resistor 46, a capacitor 47, a resistor 48 and a capacitor 49 and also through a resistor 51 to a terminal 52, from which a control voltage is supplied to a voltage controlled oscillator circuit 13. The AFC circuit 12 has the above construction.

The operation will now be described. When a synchronzing signal of negative polarity appears at the synchronizing signal input terminal 21, the transistor 22 is cut off, thus triggering the transistors 28 and 29 with bias current determined by the resistors 24 and 25. At this time, collector current determined by the source voltage $V_{CC}$ and resistors 24 and 25 flows through the transistors 28 and 29. Also, the collector voltage $V_{C28}$ is given as $$V_{C28} = V_{C37} + V_{BE28} + V_{D27} + V_{D23} - V_{D30} - V_{BE29} \doteq V_{C37} + V_{BE} \quad (1)$$

where $V_C$ represents the collector voltage through the individual transistors and the subscript figure represents the numeral designating each transistor. Likewise, $V_{BE}$ represents the base-emitter voltage across the transistors, and $V_D$ represents the voltage across the diodes.

In equation (1), $V_{BE} \simeq V_D$ holds in the case of the semiconductor integrated circuit. Thus, we have $$V_{C28} \doteq R_{41}/(R_{40}+R_{41}) \times V_{CC} \quad (2)$$

where $R_{40}$ represents the resistance of a resistor 40 and $R_{41}$ represents the resistance of a resistor 41.

Thus, in the synchronizing signal period a constant voltage $V_{C28} = V_B$ (which is produced at the juncture between resistors 40 and 41), is obtained and applied through the resistor 31 to the terminal 32. Thus, in the synchronizing signal period a capacitor 45 is charged if the terminal voltage across the capacitor 45 is low while it is discharged if the terminal voltage across the capacitor 45 is high, so that the terminal voltage across the capacitor 45 is held at a constant voltage $V_B$ during the synchronizing signal period. In cases other than the synchronizing signal period the transistor 22 is "on" and the transistors 28 and 29 are "off", so that high impedance is provided with respect to the terminal 32. On the other hand, since a flyback pulse signal is supplied to the terminal 44, a sawtooth wave voltage is produced across the capacitor 45 by the integrating circuit consisting of the resistor 43 and capacitors 42 and 45. Thus, the voltage is held at $V_B$ where the sawtooth wave voltage coincides with the phase of the synchronizing signal. From this ground, when the synchronizing signal and horizontal pulse signal are in phase with each other, $V_B$ assumes the regular center position in the waveform of the output of the terminal 32 as shown in FIG. 3A. When the phase of the horizontal pulse signal is leading with respect to the synchronizing signal a relation as shown in FIG. 3B is obtained, while with lagging phase a relation as shown in FIG. 3C is obtained. When the horizontal pulse signal deviates with respect to the synchronizing signal the average voltage of the sawtooth wave is changed, and in such case the d-c control voltage smoothed by a smoothing circuit 50 is as shown by broken lines FIGS. 3A to 3C. Thus, by applying this control voltage to the horizontal oscillating circuit 13, the oscillation frequency is controlled so that horizontal pulse signal of correct phase with respect to the synchronizing signal can always be obtained.

It will be appreciated that the capacitor 45 is used as the capacitor of the integrating circuit 33 and also as the output capacitor of the phase detection circuit, with its charging and discharging controlled to control the average voltage of the sawtooth wave such as to render it into a d-c voltage, thereby controlling the oscillating frequency. With this arrangement, the comparison signal input terminal receiving the sawtooth wave signal can also be used as the output terminal of the AFC circuit 12, thus permitting the number of terminal pins when forming a semiconductor integrated circuit to reduce from the conventional three terminals to two terminals, and this is very advantageous in view of the fabrication of semiconductor integrated circuits.

Now, the circuit construction of the VCO 13 shown in FIG. 2 will be described with reference to FIG. 2. This circuit has features that it is free from reduction of the oscillating frequency and that nevertheless steady operation can be obtained irrespective of temperature changes.

In the Figure, first and second NPN transistors 60 and 61, with the emitters thereof connected in common, constitute a differential circuit. The emitters of the transistors 60 and 61 are connected to the collector of a third transistor 62 which has its emitter connected through a resistor 63 to ground. The base of the transistor 61 is connected to a control voltage input terminal 52. The base of the third transistor 62 is connected to the collector of a fourth NPN transistor 64, which has its base and collector connected to each other, and also connected through a resistor 65 to a power source terminal 66, to which an operating voltage $V_{CC}$ is supplied. The emitter of the fourth transistor 64 is ground through a resistor 67. The first transistor 60 has its base connected to the juncture between resistors 68 and 69 connected between the power source terminal 66 and earth and its collector is directly connected to the power source terminal 66. The second transistor 61, on the other hand, has its base connected to the juncture between a resistor 70 and a charging and discharging capacitor 71 connected in series between the power source terminal 66 and earth, and its collector is connected through a load resistor 72 to the power source terminal 66. The collector of the second transistor 61 is further connected to the bases of fifth and sixth transistor 73 and 74 of PNP construction. The emitters of the fifth and sixth transistors 73 and 74 are connected through respective resistors 75 and 76 to the power source terminal 66, and their collectors are connected through respective resistors 77 and 78 to earth. The juncture between the resistor 77 and the collector of the fifth transistor 73 and that between the resistor 78 and the collector of the sixth transistor 74 are respectively connected to the bases of seventh and eighth transistors 79 and 80. The seventh transistor 79 has its emitter grounded and its collector connected through a resistor 81 to the base of the first transistor 60, and the eighth transistor 80 has its emitter grounded and its collector connected through a resistor 82 to the base of the second transistor 61. The base of the ninth transistor 83 is connected to the base of a tenth transistor 84 of NPN type, which has its emitter connected to the collector of the eighth transistor 80 and its collector connected to the emitter of the sixth transistor 74. The bases of the ninth and tenth transistors 83 and 84 are connected to the emitter of an eleventh transistor 85 of PNP type functioning as emitter follower, which has its emitter connected through a resistor 86 to the power source terminal 66 and its collector connected to earth. The base of the transistor 85 is connected to the juncture between resistors 87 and 88 connected between the power source terminal 66 and earth. The control voltage is supplied from the automatic frequency control circuit 12 through the resistor 51 and input terminal 52 to the base of the second transistor 61. The collector of the second transistor 61 is connected to the base of a twelfth transistor 92, which has its emitter connected through a resistor 93 to the power source terminal 66 and its collector connected through a resistor 94 to earth and also through a flip-flop circuit 14 to a horizontal drive circuit 15. The oscillator 13 has the above construction.

The operation of the oscillator 13 will now be described. It is now assumed that the terminal voltage across the capacitor 71 is low so that the second transistor 61 is "off" and the first transistor 60 is "on". In this state, the second transistor 61 is in the "off" state, with its collector voltage substantially constituted by the power source voltage $V_{CC}$. Thus, the fifth and sixth transistors 73 and 74 are held in the "off" state. While the transistors 73 and 74 are "off", the seventh, eighth, ninth and tenth transistors 79, 80, 83 and 84 are all "off", and the eleventh transistor 85 and resistors 86, 87 and 88 are acting as a bias circuit for the ninth and tenth transistors 83 and 84. While the second transistor 61 is "off", charging current flows through the resistor 70 to the capacitor 71, whereby a voltage increasing as an exponential function is stored in the capacitor 71. When this voltage of charging exceeds the base voltage on the first transistor 60, the second transistor 61 is triggered to turn "off" the first transistor 60. With the triggering of the second transistor 61 collector current flows through the resistor 72 to produce a voltage drop across the resistor 72, thus lowering the collector potential. As a result, the fifth and sixth transistors 73 and 74 are both triggered to cause current to pass through their emitter-collector path so as to produce voltage drop across their respective collector resistors 77 and 78, thus triggering both the seventh and eighth transistors 79 and 80. Thus, the collector voltage on the seventh and eighth transistors 79 and 80 is not reduced to be lower than a preset bias voltage determined by resistors 87 and 88 constituting a bias voltage. More particularly, when the collector voltage on the seventh and eighth transistors 79 and 80 is about to become lower than the afore-mentioned bias voltage, the ninth and tenth transistors 83 and 84 are forwardly biased to cause current to flow through the ninth and tenth transistors 83 and 84. In the case of the ninth transistor 83 the current flows through the resistor 75, the emitter-collector path of the transistor 83, the collector-emitter path of the transistor 79 to earth. Similarly, in the case of the tenth transistor 84 the current flows through the resistor 76, the collector-emitter path of the transistor 84, the collector-emitter path of the transistor 80 and earth. These current paths serve as branch paths with respect to the current path of the fifth transistor 73 and resistor 77 and that of the sixth transistor 74 and resistor 78. As a result, the base potential of the seventh and eighth transistors 79 and 80 is lowered. When the collector voltage on the seventh and eighth transistors 79 and 80 becomes higher than the bias voltage determined by the resistors 87 and 88, the ninth and tenth transistors 83 and 84 are turned "off" to cut off the branch current paths, so that the base potential on the seventh and eighth transistors 79 and 80 is not lowered. The collector voltage $V_C$ on the seventh and eighth transistors 79 and 80 when these transistors are "on" is given as $$V_C = V_{CC} \times R_{88}/(R_{87}+R_{88}) + V_{85} - V_{BE83(84)} \quad (3)$$

where $V_{CC}$ is the power source voltage, $R_{87}$ is the resistance of the resistor 87, $R_{88}$ is the resistance of the resistor 88, $V_{BE85}$ is the base-emitter voltage across the transistor 85, and $V_{BE83(84)}$ is the base-emitter voltage across the transistor 83 or transistor 84. Thus, the seventh and eighth transistors 79 or 80 are not operated in the saturation region but are operated in the active region. By setting the resistance of the resistors 82 and 70 such that the resistance of the resistor 82 is greater than the resistance of the resistor 70 with the triggering of the eighth transistor 80 the capacitor 71 is discharged through the resistor 82 and the emitter-collector path of the eighth transistor 80. When the voltage across the capacitor 71 is reduced to be less than the base voltage on the transistor 60 the second transistor 61 is turned "off" to trigger the first transistor 60. As a result, the fifth and sixth transistors 73 and 74 and seventh and eighth transistors 79 and 80 are turned "off" to cause again the charging of the capacitor 71. This sequence of events is repeated. It will be noted that with the eighth transistor 80 operated not in the saturation region but in the active region the voltage across the capacitor 71 is not reduced to be lower than the level $V_L$ because there is no delay due to storage period of transistors. Thus, it is possible to suppress variations of oscillating frequency since freedom from the reduction of the oscillating frequency and effects of temperature changes can be ensured. The oscillating frequency is taken out from the collector of the second transistor 61 and is supplied through the collector of the twelfth transistor 92 to the flip-flop circuit 14 to control the horizontal drive circuit 15 with the output of this flip-flop circuit 14. In the event if the oscillating frequency of the oscillating circuit is not synchronized to the synchronizing signal in the television signal that is received, control voltage is supplied from the automatic frequency control circuit 12 to the base of the second transistor 61 so as to synchronize the oscillating frequency and the synchronizing signal.

As is apparent from equation (3) in the integrating circuit it is comparatively readily possible to set $V_{BE85}$ and $V_{BE83(84)}$ such that $V_{BE85} \doteq V_{BE83(84)}$, that is, it is possible to replace equation (3) by $$V_C \doteq V_{CC} \times R_{88}/(R_{87}+R_{88}) \quad (4)$$

Thus, the collector voltage on the transistors 79 and 80 can be readily set by the power source voltage and the ratio between the resistances of the resistors 87 and 88.

The oscillating frequency $f_0$ of the oscillating circuit is given as $$f_0 = C_{71}\{R_{70} \cdot \log\theta \; \frac{\frac{1}{R_{68}} + \frac{R_{88}}{R_{81}(R_{87}+R_{88})}}{1 - \frac{\frac{1}{R_{68}} + \frac{1}{R_{69}} + \frac{1}{R_{81}}}{1 - \frac{R_{69}}{R_{68}+R_{69}}}} + \quad (5)$$

-continued $$\frac{R_{82} \cdot R_{70}}{R_{82} + R_{70}} \}$$

where C represents the capacitor, R represents the resistor and the subscripts represent the numerals designating the individual elements as well as the values of these elements. It will be seen from equation (5) that it is possible to construct the oscillating circuit not depending upon the power source voltage by setting the d-c current amplification factor of the transistors to be sufficiently high. Further, since the elements other than the capacitor 71 and resistors 82 and 70 are determined by the resistance ratio, this circuit can be very suitably employed in an integrating circuit, with which high precision of the resistance ratio can be obtained.

Figure 2:
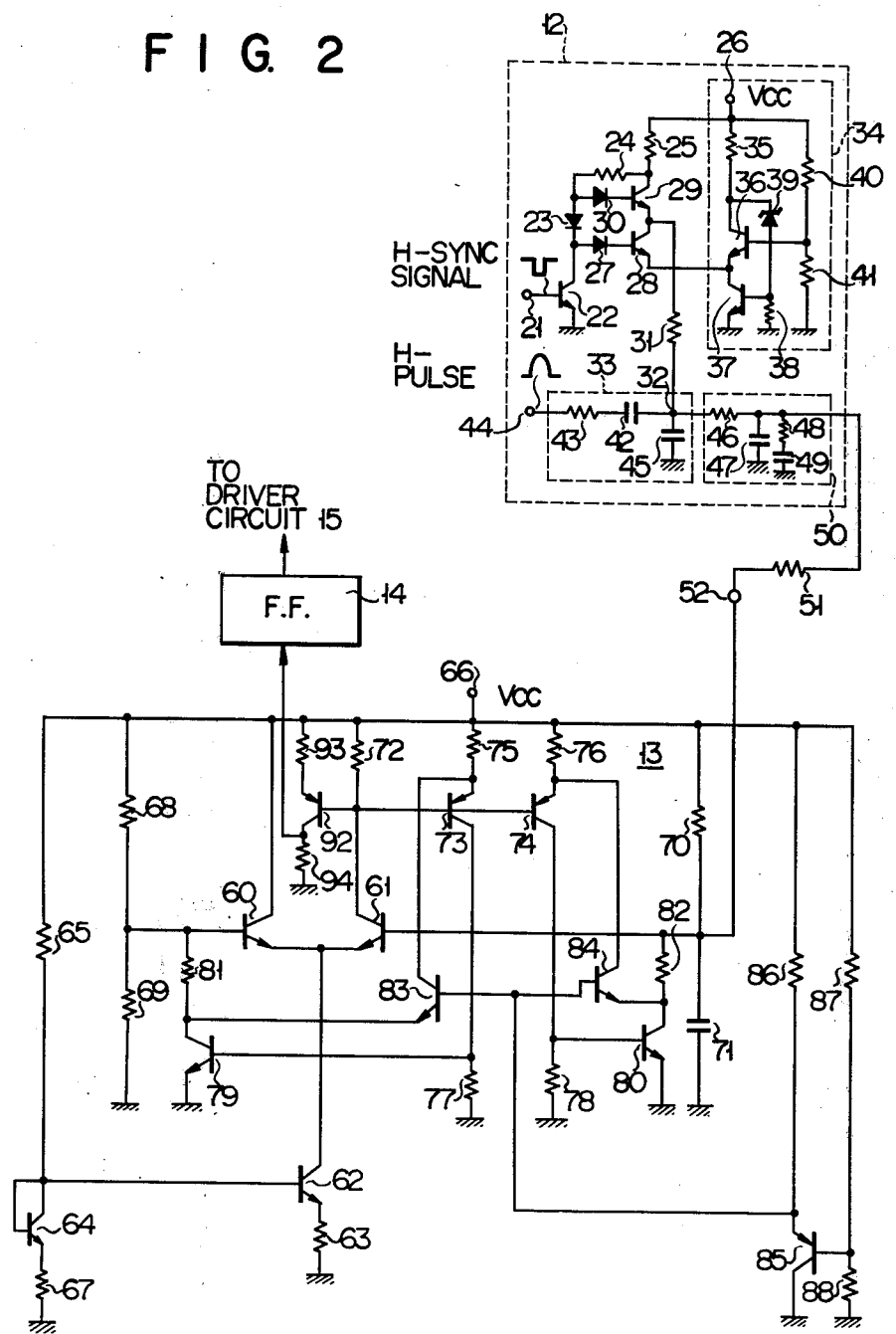
FIG. 2 is a circuit diagram showng an embodiment of the circuit according to the invention.
Figure 4:
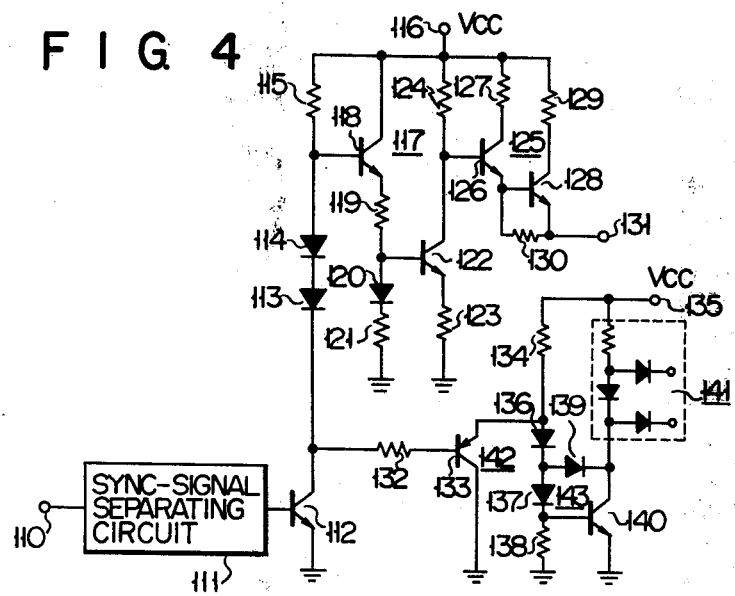
FIG. 4 is a circuit diagram showing an example of a noise removal circuit in the embodiment of FIG. 1.

The horizontal synchronizing signal, which appears at the input terminal 21 of the AFC 12 in FIG. 2, is coupled through the noise removal circuit 11 shown in FIG. 1. This circuit 11 will now be described in detail with reference to FIGS. 4 to 6. In FIG. 4, a composite television signal containing video signal and synchronizing signal is supplied to an input terminal 110. This television signal is supplied to a synchronizing signal separation time constant circuit 111 for separating the synchronizing signal which is supplied to a base of an NPN transistor 112. Thus, the sole synchronizing signal is separated from the composite television signal, and the separated synchronizing signal of negative polarity as shown in FIG. 5 appears at the collector side of the transistor 112. If noise component (b) is contained in the synchronizing signal (a), this noise signal (b) appears at the collector side of the transistor 112. The transistor 112 has the emitter connected to the reference voltage point, i.e., to earth in the illustrated case, and this collector through a series circuit consisting of bias diodes 113 and 114 and resistor 115 to a power source terminal 116, to which the power source voltage $V_{CC}$ is applied. The resistor 115 is connected at its opposite ends to the collector and base of an NPN transistor 118 of a current mirror amplifier 117, with the emitter of the transistor 118 connected through a series circuit consisting of resistor 119, diode 120 and resistor 121 to earth. The juncture between the resistor 119 and diode 120 is connected to the base of an NPN transistor 122 constituting the amplifier 117, with the transistor 122 having its emitter connected through a resistor 123 to earth and its collector connected through a resistor 124 to the power source terminal 116. Thus, the synchronizing signal as shown in FIG. 5, appearing at the collector of the transistor 112, is subjected to polarity inversion by the current mirror amplifier 117, and the signal component appearing across the resistor 115 is thus made to appear through mere polarity inversion across the resistor 124. The juncture between the resistor 124 and the collector of the transistor 122 is connected to the base of an NPN transistor 126 constituting a buffer amplifier 125, with the collector of the transistor 126 connected through a resistor 127 to the power source terminal 116. The transistor 126 has its emitter connected to the base of another NPN transistor 128 which also constitutes the amplifier 125 and its collector connected through a resistor 129 to the power source terminal 116. A resistor 130 is connected between the base and emitter of the transmitter 128, and the juncture between the resistor 130 and the emitter is connected to an output terminal 131. Thus, the synchronizing signal produced across the resistor 124 is amplified by the buffer amplifier 125 before it is taken out from the output terminal 131, and this output terminal 131 is connected to a succeeding vertical oscillating circuit or burst gate circuit (not shown). The synchronizing signal separated by the transistor 112 and appearing at the collector thereof is supplied through a resistor 132 to the base of a lateral PNP transistor 133. This transistor 133 has its collector connected to earth and its emitter connected through a resistor 134 to a power source terminal 135. Although the power source terminal 135 is shown separately of the afore-mentioned power source terminal 116, they are constituted by a single terminal in practice. The emitter of the transistor 133 is further connected through a series circuit consisting of diodes 136 and 137 with the anode thereof directed to the emitter side and a resistor 138 to earth. The juncture between the diodes 136 and 137 is connected to the anode of a diode 139 with the cathode thereof connected to the collector of an NPN transistor 140. The transistor 140 has its base connected to the juncture between the diode 137 and resistor 138 and its emitter connected to earth. Its collector is connected through a load circuit 141 (for instance a switching circuit for automatic frequency control) to the power source terminal 135. The transistor 133 and diode 136 here constitute a noise limiter circuit 142, and the diodes 137 and 139 and transistor 140 constitute a non-saturation type amplifier 133. The lateral PNP transistor 133 removes (or restricts) noise components by making use of the fact that its transmission characteristics are inferior so that its capability of passing the noise components is inferior, and high frequencies such as noise signals are difficult to pass through it. In addition, the equivalent capacitance of the transistor 133 is provided between the base and earth, with an integrating effect provided by the resistance of the resistor 132 and this capacitance to the end of removal of the noise components. The diode 136 is provided for level setting. The transistor 133 is triggered only when the collector potential on the transistor 112 becomes less than $2V_{BE}$ ($V_{BE}$ being the base-emitter voltage across the transistor). Thus, small noise signals below the level $2V_{BE}$ are removed as shown in FIG. 5. Althrough noise components greater than the level $2V_{BE}$ pass through the transistor 133 and are transmitted to the base of the transistor 140 of the non-saturation type amplifier 143, with the noise components transmitted to the base of the transistor 140 the same transistor is cut off. Thus, even if the collector voltage is increased for a short period of time, the transistor 140 is triggered without substantial delay with respect to this noise component as shown in FIG. 6, so that there is no problem in practice. From the above ground, even if generation of noise component in weak electric field as shown in FIG. 5 takes place on the collector side of the transistor 112, since the signal supplied to the load circuit is limited to only thin end portions above the level $2V_{BE}$ in the noise component, the noise can be practically removed and thus has no substantial effect upon the operation of the switching circuit for the automatic frequency control.

The above PNP transistor 133 can be replaced with a diode in the semiconductor integrated circuit. In this case, although the level setting is possible, since the capacitance is small the integrating effect together with the resistor 132 can be hardly expected.

The driver circuit 15 shown in FIG. 1 will now be described in detail with reference to FIG. 7. This circuit is not restricted to use for color television receivers only, but since its pronounced effects can be obtained when it is applied to the color television receiver, an example of application to the horizontal drive stage in a color television receiver will be described.

Figure 7:
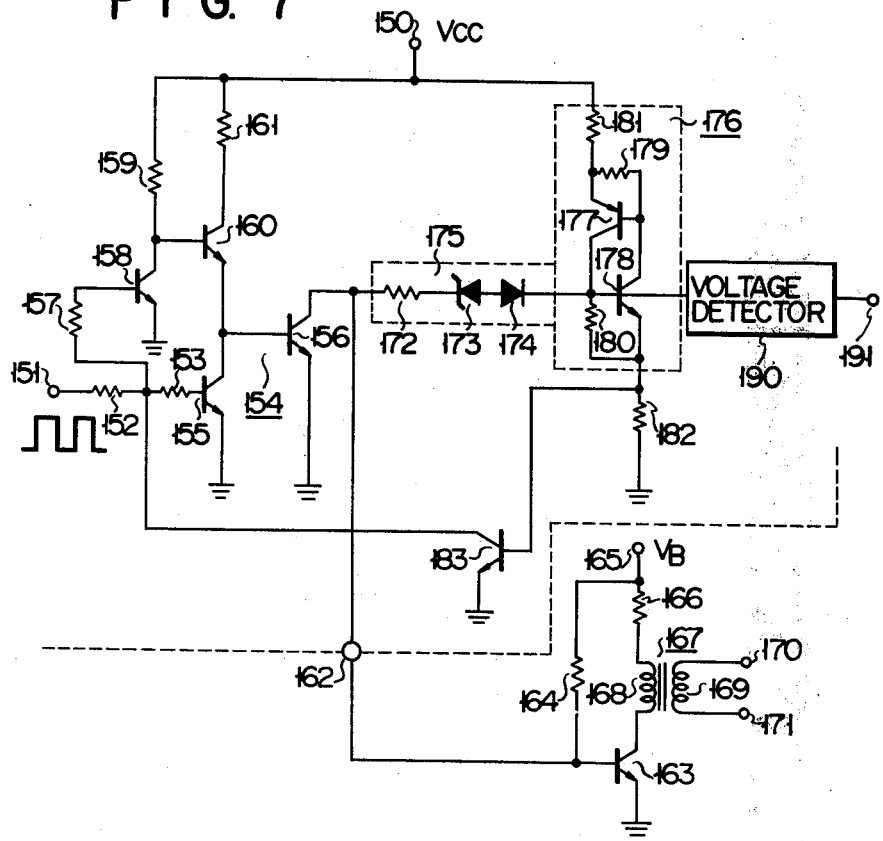
FIG. 7 is a circuit diagram showing an example of the drive circuit in the embodiment of FIG. 1.

FIG. 7 shows a circuit construction of a circuit for coupling the oscillating output from a horizontal oscillating stage to a drive stage and an abnormal voltage detection circuit. A specific circuit construction and operation thereof will first be described.

A horizontal drive signal at 15.75 KHz produced from a horizontal oscillation stage 13 (not shown) is supplied to a terminal 151, and it is coupled through two series resistors 152 and 153 to the base of an NPN input transistor 155 consisting of a direct coupling type multi-stage amplifier 154. The transistor 155 has its emitter grounded and its collector connected to the base of an NPN output transistor 156 constituting the direct coupling multi-stage amplifier 154. The drive signal, which is supplied to the base of the input transistor 155, is also coupled through the juncture between the resistors 152 and 153 and also through a resistor 157 to a base of an NPN transistor 158 serving as inverter. The transistor 158 has its emitter grounded and its collector connected through a resistor 159 to a power source terminal 150, to which a predetermined power source voltage $V_{CC}$ is supplied. Thus, the drive signal supplied to the terminal 151 is subjected to polarity inversion by the NPN transistor 158 as inverter, and the inverted drive signal is produced at the collector of this transistor. The juncture between the collector of this transistor and resistor 159 is connected to the base of an NPN transistor 160 constituting a push-pull construction together with the input transistor 155, and the output of the NPN transistor 158 as inverter is used to switch the transistor 160. The transistor 160 has its collector connected through a resistor 161 to the power source terminal 150 and its emitter connected to the collector of the input transistor 155. Thus, the base of the output transistor 156 is connected to the juncture between the collector of the input transistor 155 and the emitter of the transistor 160. As a result, the drive signal from the terminal 151 is coupled directly to the base of the input transistor 155 while it is also coupled through the inverter transistor 158 to the base of the transistor 160, so that both the transistors 155 and 160 are alternately switched by the drive signal. More particularly, when the transistor 160 is "on" while the transistor 155 is "off", base current flows through the transistor 160 into the base of the output transistor 156 to trigger the transistor 156. When the transistor 155 is triggered to cut off the transistor 155 with the subsequent drive signal, the base current through the transistor 156 is led through the emitter collector path of the transistor 160 to turn on the transistor 156. This means that when the transistor 160 is "on," it functions as emitter follower to provide low impedance to quickly trigger the transistor 156, and when the transistor 155 is "on" low impedance is similarly provided to quickly cut off the transistor 156. In this way, the response to signal is improved. These circuits are designed such that they are suited for fabrication into semiconductor integrated circuits, and where no particular consideration of fabrication of semiconductor integrated circuits is given the inverter transistor 158 and transistor 160, which are of the NPN structure, may be replaced with a single PNP transistor in complementary relation to the transistor 155. Alternatively, these transistors 158 and 160 may be omitted, and in lieu of the push-pull structure the collector of the transistor 155 may be connected through the sole resistor 161 to the power source terminal 150 so as to obtain the drive signal for driving the transistor 156 from the juncture between this collector and resistor 161. The output transistor 156 of the direct coupling type multi-stage amplifier circuit 154 is driven in this way. This transistor 156 has its emitter grounded and its collector connected to a terminal 162 of the integrating circuit and thence to the base of a horizontal drive transistor 163 outside the integrating circuit for driving the transistor 163. Coupled to the base of this transistor 163 through a resistor 164 is a power source voltage $V_B$ from a power source terminal 165, and this power source voltage is also coupled through a series circuit consisting of a resistor 166 and the primary winding 168 of a drive transformer 167 to the collector of the transistor 163, which has its emitter connected to earth. Thus, switching action of the drive transistor 163 is caused as it is driven by the output of the transistor 156 to cause a pulse signal to appear across the primary winding 168 of the drive transformer 167, and this pulse signal is taken out from the second winding 169, that is, it it taken out as drive signal coupled from output terminals 170 and 171 to the next stage horizontal output circuit (not shown). In case if such trouble as opening of the emitter of this drive transistor 163 is caused by some cause or other, abnormal voltage is produced at the collector of the transistor 156. If this takes place, a reverse bias of high voltage is impressed upon the transistor 156 in the "off" period thereof, thus leading to thermal rupture of this transistor 156. Once the transistor 156 is thermally broken the function of the entire integrating circuit is spoiled, and in this case replacement of the entire integrating circuit is compelled. Accordingly, the collector of the transistor 156 is connected to one end of an abnormal voltage detection circuit 175 comprising a series circuit consisting of a resistor 172, a zener diode 173 and a diode 174, with the other end of this circuit 175 connected to a flip-flop circuit, that is, SCR switch circuit 176. The SCR switch circuit 176 consists of a combination of a PNP transistor 177 and an NPN transistor 178, with the SCR structure constructed by connecting the collector of the transistor 177 and the base of the transistor 178, connecting the collector of the transistor 178 and the base of the transistor 177 and also connecting resistors 179 and 180 between the base and emitter of the respective transistors 177 and 178. The transistor 177 has its emitter connected through a resistor 181 to the power source terminal 150, and the other transistor 178 has its emitter connected through a resistor 182 to earth. The connection between this SCR switch circuit 176 and abnormal voltage detection circuit 175 is effected by connecting the cathode side of the diode 174 to the base of the transistor 178. When the drive transistor 163 is in normal operation, that is, when the collector voltage on the transistor 156 is within the normal operating voltage region, the abnormal voltage detection circuit 175 is not rendered conductive so that it does not trigger the SCR switch circuit 176. Thus, in this case no voltage is produced across the resistor 182 of the SCR switch circuit 176. On the other hand, when the collector voltage on the transistor 156 is abnormally increased, the abnormal voltage detection circuit 175 detects this voltage to cause current to flow through the resistor 172, zener diode 173 and diode 174 in the detection circuit 175, thus triggering the SCR switch circuit 176. Thus, the SCR switch circuit 176 functions to cause current to flow through the resistor 182, causing positive voltage to be produced across this resistor. Since this SCR switch circuit 176 has an SCR construction, it continues to hold this state unless the power source is disconnected, and thus the positive voltage produced remains to prevail across the resistor 182. The resistor 182 is connected to the base of an NPN switching transistor 183, which has its emitter grounded and its collector connected to the juncture between the resistors 152 and 153. Thus, so long as the circuit operates normally, no positive voltage is produced across the resistor 182, and thus the transistor 183 remains in the "off" state and has no effects upon the circuit at all. However, once the transistor 183 is triggered with generation of positive voltage across the resistor 182, the juncture between the resistors 152 and 153 is grounded through the emitter-collector path of the transistor 183. As a result, the base potential on the transistor 155 is lowered substantially down to the earth potential to cut off the transistor 155, and this state is maintained until the SCR switch circuit 176 is inverted. At the same time, the base potential on the inverter transistor 158 is lowered substantially down to the earth potential, so that this transistor 158 is similarly cut off. With the cutting-off of the transistor 158 the transistor 160 is triggered to maintain the "on" state irrespective of the input drive signal. As a result, the "on" state of the transistor 160 and the "off" state of the transistor 155 are simultaneously provided, so that the transistor 156 continues to be held "on". With the transistor 156 continuously held "on", when an abnormal voltage is produced on the collector of this transistor, current flows from the power source terminal 165 through the transistor 164 into this transistor, but the fact that this transistor is "on" the collector voltage thereon is very low, namely of the order of 0.2V, has the effect of protecting this transistor, that is, the integrating circuit, from the abnormal voltage, and only very slight power is consumed to this end.

As has been shown, even in the abnormal state stemming from such cause as opening of the emitter of the drive transistor 163 the transistor 156 can be protected against rupture that might otherwise result from appearance of the abnormal voltage. The illustrated structure may be used not only for the protection of the integrating circuit from abnormal voltage produced due to such cause as opening of the emitter of the drive transistor 163, but it may also be used in combination with other circuits. In other words, although in the above description the SCR switch circuit 176 is triggered with the output of the abnormal voltage detection circuit 175, similar operation can be obtained by triggering the SCR switch circuit 176 with a different circuit. As an example of the different circuit application of the abnormal voltage detection circuit to the prevention of X-ray generation will now be described.

It has been well known in the art that X-radiation in excess of a prescribed quantity is generated in the color cathode-ray tube with application of an anode voltage above a predetermined high voltage. This means that in order to suppress generation of the X-radiation to be less than the prescribed quantity the anode voltage applied to the color cathode-ray tube may be held within the predetermined value. Accordingly, in the case of FIG. 7 the SCR switch circuit 176 is adapted to be triggered by the anode voltage detection circuit 190 when the anode voltage exceeds a predetermined value. Although the anode voltage detection circuit 190 is different in its expression from the abnormal voltage detection circuit, it has the same function as the abnormal voltage detection circuit 175. In other words, although the expression is changed for the former in order to distinguish the operation thereof from the afore-mentioned operation since the voltage of detection is different, both belong to the abnormal voltage detection circuit. In the use as the anode voltage detection circuit 190, increase of anode current due to increase of the anode voltage beyond the predetermined value is detected and is converted into a corresponding voltage. More particularly, since the anode current flows through the secondary winding of the flyback transformer, a voltage detection resistor is inserted in the secondary winding for on-off operating the transistor according to the voltage produced across this resistor, whereby the output of the transistor is used as trigger signal for the SCR switch circuit 176. Alternatively, a winding for X-radiation voltage detection may be particularly provided on the secondary winding of the flyback transformer, whereby a trigger output may be obtained through control of a transistor or a diode by detecting the voltage produced in the winding. As a further alternative, it is possible to arrange such as to detect the output of a rectifying circuit connected to the flyback transformer and detect the anode voltage from the detected output. It will be understood that various circuit constructions can be contemplated as the anode voltage detection circuit 190, and which may naturally include other circuits than but having the similar operation as the anode voltage detection circuit 190. A terminal 191 is connected to a horizontal output circuit (not shown). With the anode voltage detection circuit 190, when the anode voltage is increased beyond a predetermined value a trigger output is produced from the anode voltage detection circuit 190 to trigger the SCR switch circuit 176 mentioned above. With the triggering of the SCR switch circuit 176 a positive voltage is produced across the resistor 182 to trigger the transistor 183 and cut off the transistors 155 and 158, whereby the transistors 156 and 160 are held in the "on" state. With the transistor 156 continuously held in the "on" state the drive transistor 163 makes no switching action, so that no pulse signal is produced at the collector of this transistor 163. Without any drive signal produced in the secondary winding of the drive transformer 167 the next stage horizontal output transistor is not driven, so that high voltage, that is, anode voltage, is not produced. As a result, the generation of X-rays can be prevented. Since the generation of X-rays accompanying the increase of the anode voltage can be prevented, it is possible to eliminate otherwise possible adverse effects of the X-radiation upon the human body.

While in the foregoing description the SCR switch circuit 176 is constructed with SCR connection constituted by a combination circuit of the PNP transistor 177 and NPN transistor 178, it may be constructed with an SCR element itself as well. Although integration of the SCR element into a semiconductor integrated circuit is possible since it has a semiconductor four-electrode structure, the aforementioned combination of transistors can be used more advantageously from the standpoint of its structure. Of course the discrete SCR element can be used in case where the integration into a semiconductor integrated circuit is not made. The SCR connection as described above is used since the SCR switch circuit 176 is always set in the "off" state at the time of connecting the power source. In case of using the ordinary flip-flop circuit the probability that the SCR switch circuit is in the "off" state at the time of connection of the power source is usually 50%. In the event if the SCR switch circuit is set in the "on" state at the time of connection of the power source, a positive voltage is produced across the resistor 182 as mentioned earlier, thus triggering the transistor 183. Consequently, the transistor 156 is continuously held "on". Therefore, the horizontal output circuit is not operated, so that no anode voltage is produced, and hence no image is reproduced on the color picture tube screen. From this ground, the use of the flip-flop circuit has an inconvenience that the power source switch has to be repeatedly on-off operated until normal image reproduction is obtained on the screen. This drawback can be overcome by the use of the SCR connection.

What we claim is:

1. An automatic frequency control circuit comprising two switching transistors with the emitter-collector paths thereof connected in series with each other between a power source and a reference voltage source, a means for commonly coupling a horizontal synchronizing signal to the bases of said switching transistors, an integrating circuit having an input terminal receiving a horizontal pulse signal and an output terminal connected to the emitter-collector juncture between said two switching transistors, a smoothing circuit to convert the output voltage of said integrating circuit into a d-c output voltage, a voltage controlled oscillator to produce a frequency output in accordance with the d-c output voltage of said smoothing circuit, and a means for coupling the output of said voltage controlled oscillator to said input terminal of said integrating circuit.

2. The automatic frequency control circuit according to claim 1, wherein said synchronizing signal is coupled through a noise removal circuit to the bases of said switching transistors, said noise removal circuit including a synchronizing signal output transistor for producing a synchronizing signal of negative polarity on the collector side, a collector-grounded PNP transistor with the base thereof connected through a resistor to the collector of said synchronizing signal output transistor, and a non-saturation type amplifier having an input terminal connected to the emitter of said PNP transistor, said non-saturation type amplifier being adapted to be operated when the collector potential on said synchronizing signal output transistor becomes lower than a predetermined threshold level.

3. The automatic frequency control circuit according to claim 1, wherein said voltage controlled oscillator includes first and second transistors differentially connected to each other, a voltage division circuit to supply a division voltage to the base of said first transistor, a capacitor for charging and discharging connected to the base of said second transistor, a charging means for charging said capacitor, a third transistor controlled by at least one of the outputs of said first and second transistors for controlling the base bias on said first transistor, a fourth transistor constituting a path of discharging of said capacitor, and a control means for operating at least said fourth transistor in the non-saturation region, said d-c output voltage being coupled to the base of said second transistor.

4. The automatic frequency control circuit according to claim 3, wherein said control circuit includes a fifth transistor having the emitter-collector path thereof connected between the power source side of a circuit to control the base bias on said first transistor and the collector of said fourth transistor, and an emitter follower for providing a base bias on said fifth transistor, said base bias being set by a voltage divider.

5. The automatic frequency control circuit according to claim 1, wherein the output of said voltage controlled oscillator is coupled to a direct coupling type multi-stage amplifier circuit, a switching transistor connected to the multi-stage amplifier circuit, an SCR switch circuit for driving said switching transistor, an abnormal voltage detection circuit for triggering said SCR switch circuit, and an output stage transistor on the output side of said amplifier circuit and adapted to be held in the conduction state by said switching transistor.

6. The automatic frequency control circuit according to claim 5, wherein said abnormal voltage detection circuit includes a circuit for detecting the collector voltage of said output stage transistor.

7. The automatic frequency control circuit according to claim 5, wherein said abnormal voltage detection circuit includes a circuit for detecting a voltage corresponding to the anode current in a cathode-ray tube.

8. The automatic frequency control circuit according to claim 5, wherein at least one flip-flop is provided between the output terminal of said voltage controlled oscillator and the input terminal of said direct coupling type multi-stage amplifier circuit.

* * * * *